United States Patent
Li et al.

(10) Patent No.: US 8,059,416 B2
(45) Date of Patent: Nov. 15, 2011

(54) MULTI-CAVITY ELECTROMAGNETIC SHIELDING DEVICE

(75) Inventors: Kuan-Hsing Li, Taichung (TW); Chih-Hsien Chiu, Changhua (TW)

(73) Assignee: Universal Scientific Industrial (Shanghai) Co., Ltd., Shanghai (CN)

( * ) Notice: Subject to any disclaimer, the term of this patent is extended or adjusted under 35 U.S.C. 154(b) by 898 days.

(21) Appl. No.: 12/059,198

(22) Filed: Mar. 31, 2008

(65) Prior Publication Data

US 2009/0244876 A1    Oct. 1, 2009

(51) Int. Cl.
    *H05K 5/00* (2006.01)
(52) U.S. Cl. ........ 361/752; 361/818; 361/804; 361/816; 361/820
(58) Field of Classification Search .................. 361/818, 361/804, 816, 820
    See application file for complete search history.

(56) References Cited

U.S. PATENT DOCUMENTS

| | | | | |
|---|---|---|---|---|
| 5,763,824 A | * | 6/1998 | King et al. | 174/374 |
| 5,774,344 A | * | 6/1998 | Casebolt | 361/800 |
| 6,031,732 A | * | 2/2000 | Koike et al. | 361/816 |
| 6,169,665 B1 | * | 1/2001 | Lepping et al. | 361/800 |
| 6,377,472 B1 | * | 4/2002 | Fan | 361/800 |
| 7,262,369 B1 | * | 8/2007 | English | 174/370 |
| 2006/0002099 A1 | * | 1/2006 | Stoneham et al. | 361/816 |
| 2006/0153736 A1 | * | 7/2006 | Kalra et al. | 422/57 |

* cited by examiner

*Primary Examiner* — Tuan T Dinh
*Assistant Examiner* — Steven Sawyer
(74) *Attorney, Agent, or Firm* — Vedder Price P.C.

(57) ABSTRACT

An electromagnetic shielding device includes a metal frame mounted on a circuit board and having a looped surrounding wall configured with an inner space divided into first and second space portions by a partition wall unit. A cover is mounted fittingly into the inner space in the metal frame, and includes a dielectric cover body, and a conductive material layer attached to an outer surface of the cover body. The cover body has a looped surrounding wall extending downwardly from a periphery of a top wall and disposed in proximity to the looped surrounding wall of the metal frame such that the conductive material layer is in electrical contact with the looped surrounding wall of the metal frame. The cover cooperates with the metal frame to define first and second cavities having different depths and corresponding respectively to the first and second space portions.

12 Claims, 6 Drawing Sheets

MULTI-CAVITY ELECTROMAGNETIC SHIELDING DEVICE

BACKGROUND OF THE INVENTION

1. Field of the Invention

The invention relates to an electromagnetic shielding device, more particularly to a multi-cavity electromagnetic shielding device.

2. Description of the Related Art

FIGS. 1 and 2 illustrate an electronic device employing a conventional electromagnetic shielding device that includes a metal frame 1 and a metal cover 2. The metal frame 1 is mounted on a circuit board 3 via a looped solder pad unit 31 using surface mounting techniques. The circuit board 1 is mounted with first and second electronic component units 301, 302 that are spaced apart from each other, wherein the first electronic component unit 301 has a height greater than that of the second electronic component unit 302. The metal frame 1 has a looped surrounding wall configured with an inner space 103 that is divided by a partition wall 12 into a first space portion 101 for receiving the first electronic component unit 301, and a second space portion 102 for receiving the second electronic component unit 302. The metal cover 2 is mounted on the circuit board 3, and covers the metal frame 2. The metal cover 2 has a top wall 201 disposed on a top side of the metal frame 1, and a looped surrounding wall 202 extending downwardly from a periphery of the top wall 201 and disposed in proximity to the looped surrounding wall 11 of the metal frame 1 such that the metal frame 1 cooperates with the metal cover 2 so as to define first and second cavities corresponding respectively to the first and second space portions 101, 102.

It is noted that, since the metal cover 2 is formed by pressing, it is difficult to fabricate the metal cover having various thicknesses, and various heights relative to the circuit board 3. As a result, even though the heights of the first and second electronic component units 301 and 302 are different, the metal cover 2 of the conventional electromagnetic shielding device has a uniform height (h), such as 2 mm, and a thickness ranged from 0.15 mm to 0.2 mm. Therefore, the electronic device employing the conventional electromagnetic shielding device has a relatively large size, thereby impeding miniaturization of the electronic device.

SUMMARY OF THE INVENTION

Therefore, the object of the present invention is to provide a multi-cavity electromagnetic shielding device that can overcome the aforesaid drawbacks of the prior art.

According to one aspect of the present invention, there is provided an electromagnetic shielding device adapted to be disposed on a circuit board. The electromagnetic shielding device comprises:

a metal frame adapted to be mounted on the circuit board and including a looped surrounding wall configured with an inner space, and a partition wall unit connected to the looped surrounding wall for dividing the inner space into at least first and second space portions; and a cover mounted fittingly into the inner space in the metal frame, and including a dielectric cover body having an outer surface, and a conductive material layer attached to the outer surface of the dielectric cover body, the cover body having a top wall, and a looped surrounding wall extending downwardly from a periphery of the top wall and disposed in proximity to the looped surrounding wall of the metal frame such that the conductive material layer is in electrical contact with the looped surrounding wall of the metal frame, the cover cooperating with the metal frame so as to define at least first and second cavities corresponding respectively to the first and second space portions of the inner space in the metal frame, the first and second cavities having different depths.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
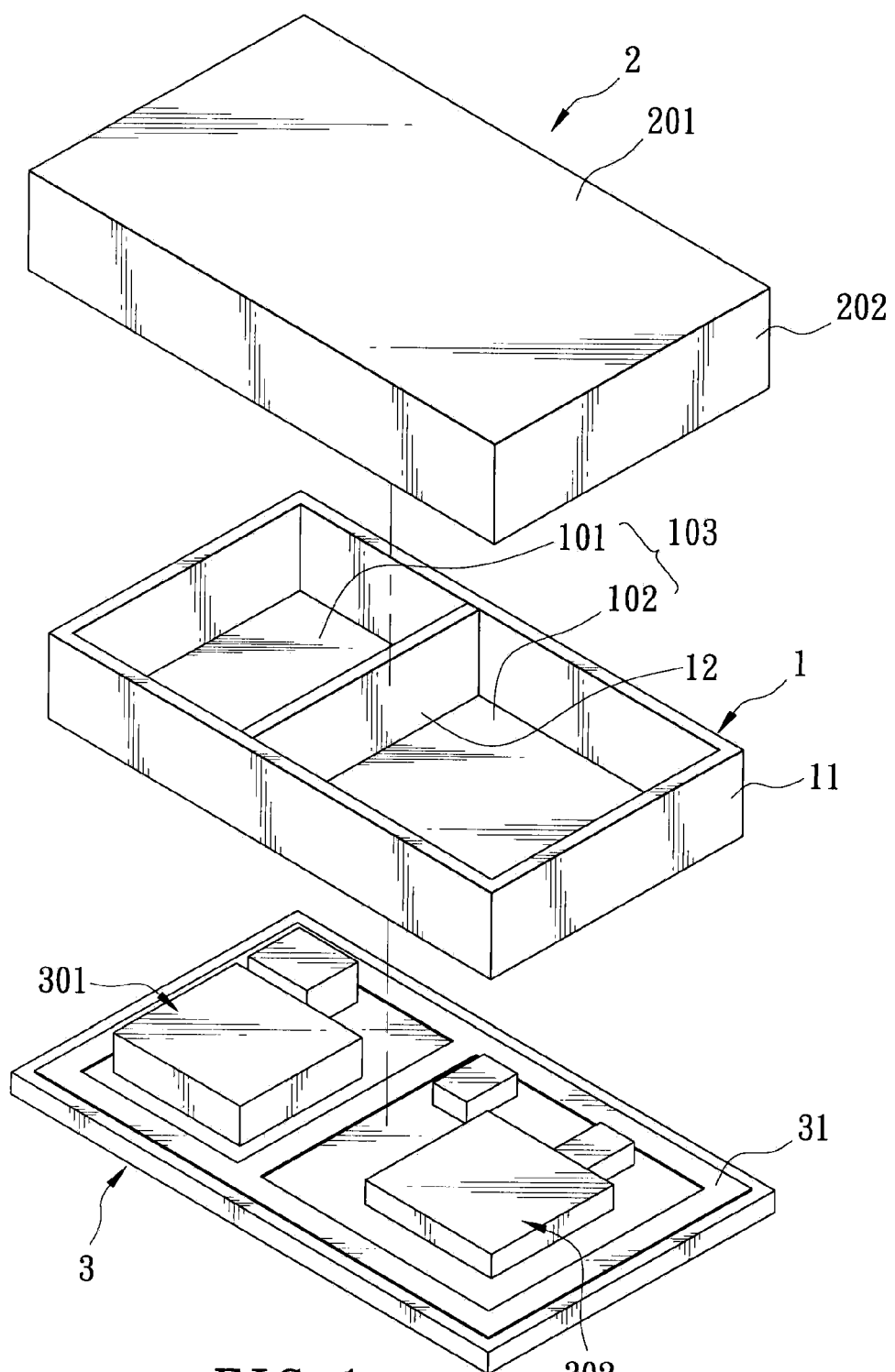
FIG. 1 is a partly exploded perspective view of an electronic device employing a conventional electromagnetic shielding device.
Figure 2:
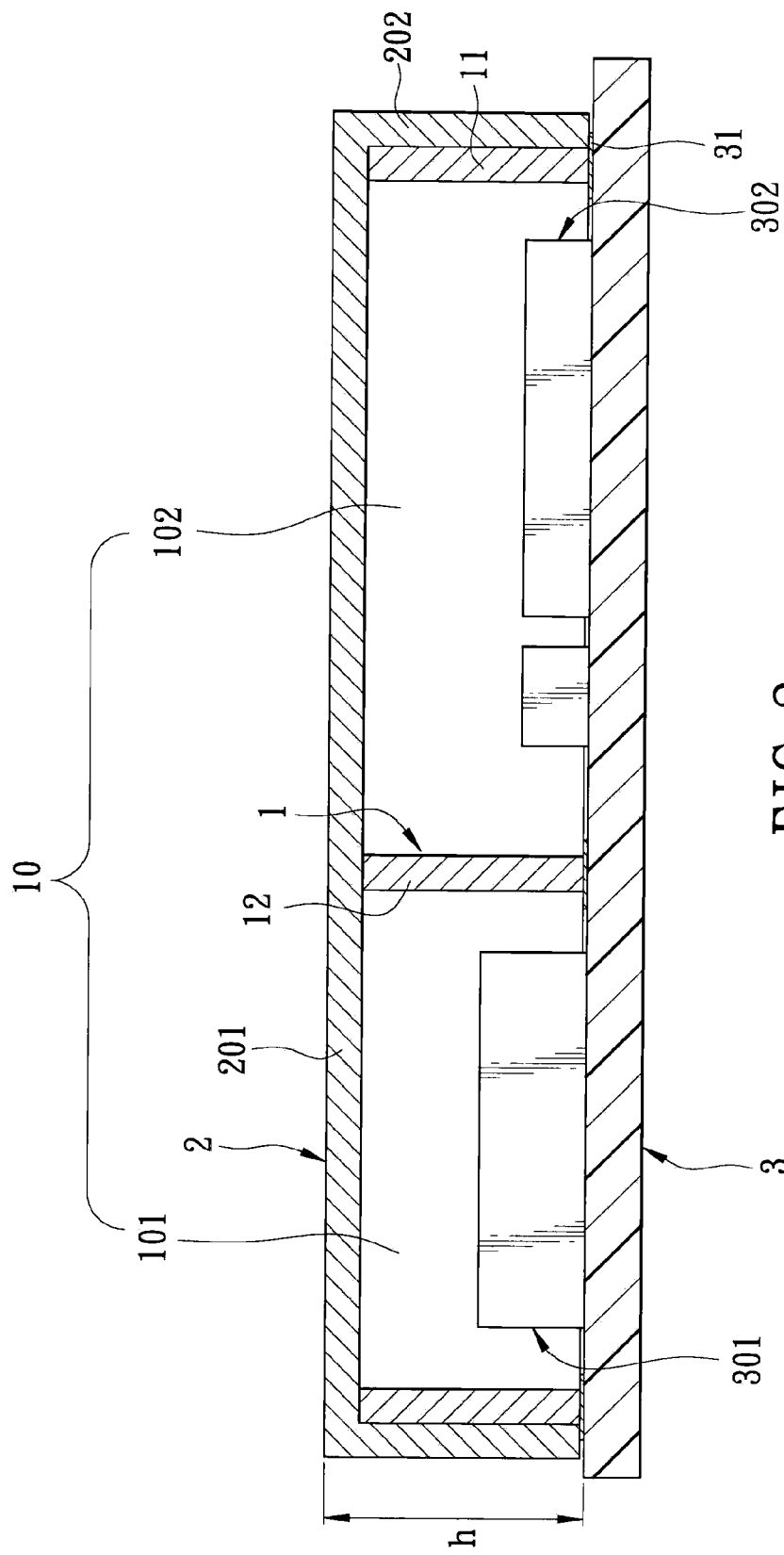
FIG. 2 is a schematic sectional view of the electronic device employing the conventional electromagnetic shielding device.

Before the present invention is described in greater detail, it should be noted that like elements are denoted by the same reference numerals throughout the disclosure.

Figure 3:
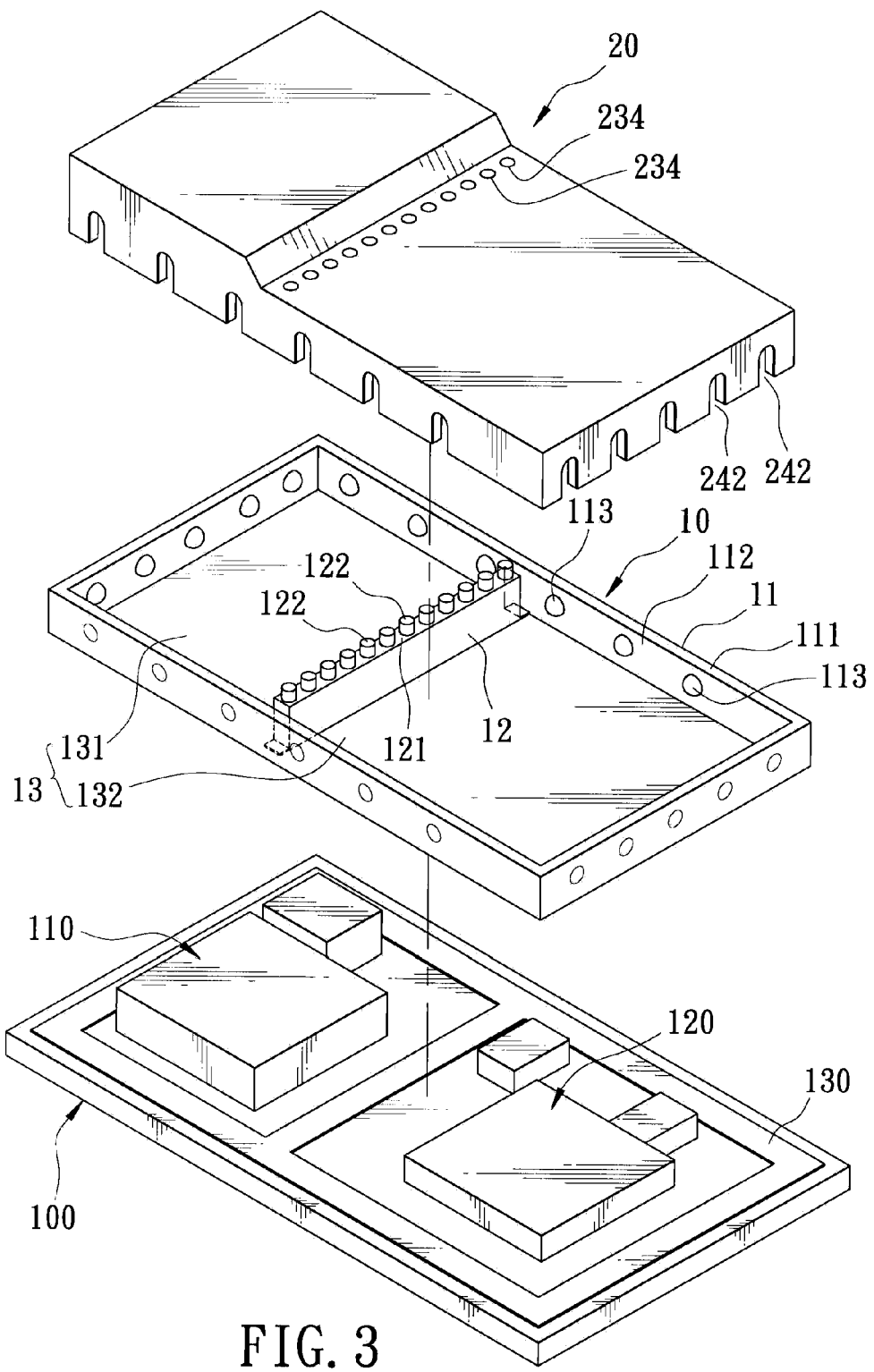
FIG. 3 is a partly exploded perspective view showing an electronic device employing the first preferred embodiment of an electromagnetic shielding device according to the present invention.
Figure 4:
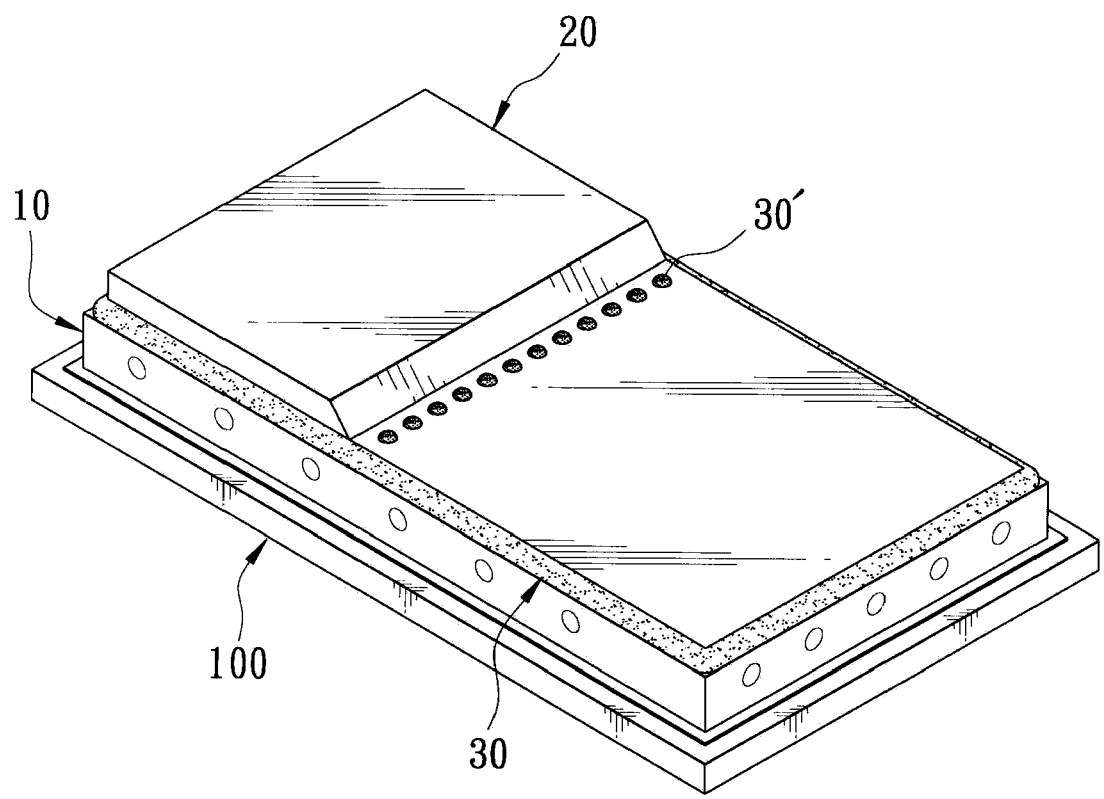
FIG. 4 is an assembled perspective view showing the electronic device employing the first preferred embodiment.
Figure 5:
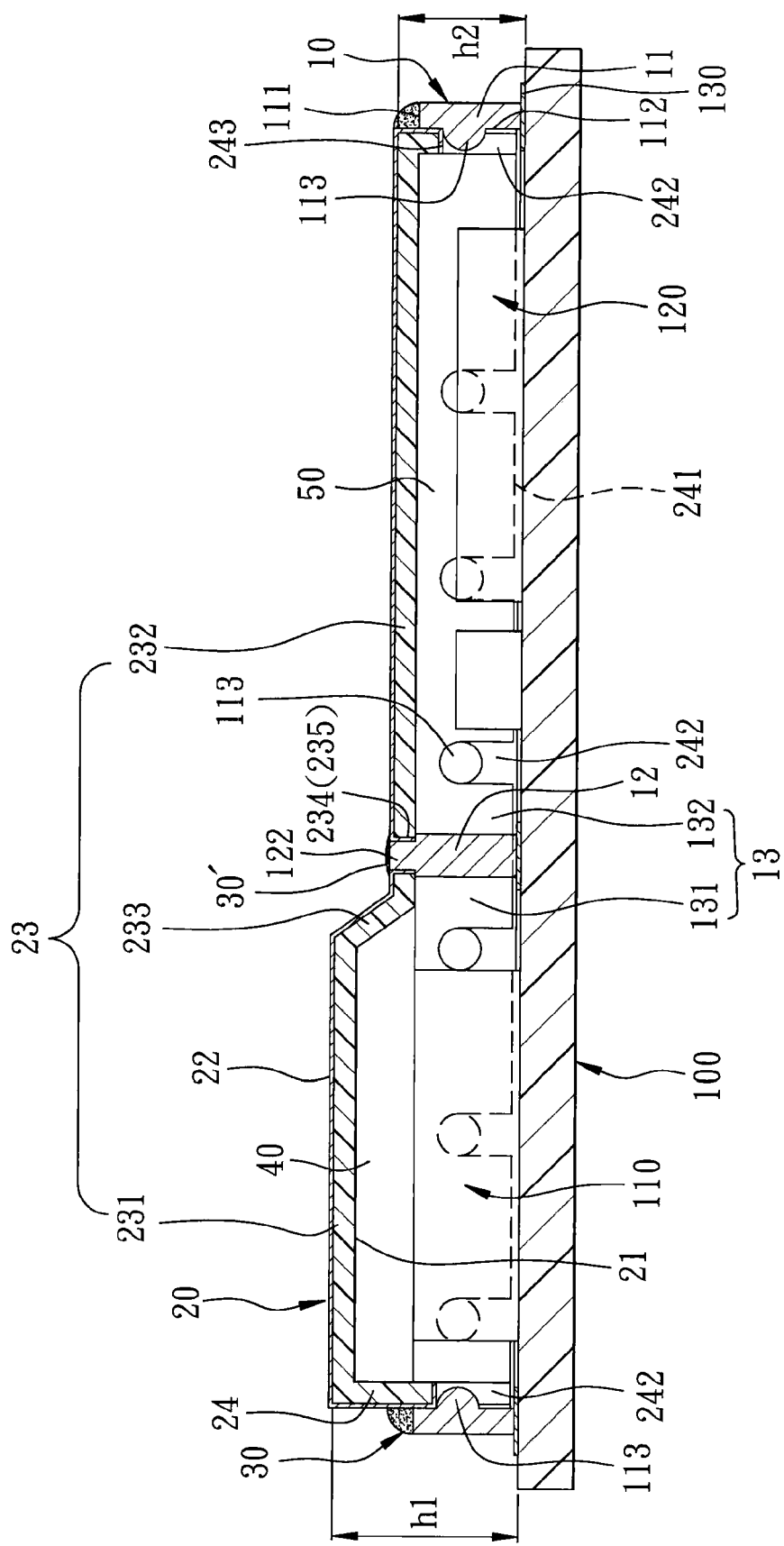
FIG. 5 is a schematic sectional view showing the electronic device employing the first preferred embodiment of an electromagnetic shielding device according to the present invention.

Referring to FIGS. 3 to 5, the first preferred embodiment of an electromagnetic shielding device according to the present invention is shown to be embodied in an electronic device. The electronic device includes a rectangular circuit board 100, and first and second electronic component units 110, 120 mounted on the circuit board 100 and spaced apart from each other. The first electronic component unit 110 has a height greater than that of the second electronic component unit 120. The electromagnetic shielding device is adapted to be disposed on the circuit board 100, and includes a metal frame 10 and a metal cover 20.

The metal frame 10 is adapted to be mounted on the circuit board 100 via a looped solder pad unit 130, which is attached to the circuit board 100, using surface mounting techniques. The metal frame 10 includes a looped surrounding wall 11 and a partition wall unit. The looped surrounding wall 11 is configured with an inner space 13, and has a looped inner surface 112 formed integrally with a plurality of protrusions 113 that are spaced apart from each other. In this embodiment, the partition wall unit includes a partition wall 12 connected to the looped surrounding wall 11 for dividing the inner space 13 into first and second space portions 131, 132. The partition wall 12 has a top end 121 formed integrally with a plurality of positioning pins 122 that are spaced apart from each other.

The cover 20 is mounted fittingly into the inner space 13 in the metal frame 10, and includes a dielectric cover body 21 and a conductive material layer 22. The cover body 21 is made of a plastic material, is formed by injection molding, and has an outer surface. The conductive material layer 22 is made of metallic paint, and is attached to the outer surface of the cover body 21. The cover body 21 has a top wall 23, and a looped surrounding wall 24 extending downwardly from a periphery of the top wall 23 and disposed in proximity to the looped surrounding wall 11 of the metal frame 10 such that the conductive material layer 22 is in electrical contact with the looped surrounding wall 11 of the metal frame 10, as shown in FIG. 5. The cover 20 cooperates with the metal frame 10 so as to define first and second cavities 40, 50 corresponding respectively to the first and second space portions 131, 132 in the metal frame 10. The depth of the first cavity 40 is greater than that of the second cavity 50. In this embodiment, the looped surrounding wall 24 of the cover body 21 has a bottom end 241 formed with a plurality of notches 242 that are spaced apart from each other and that engage respectively the protrusions 113 of the metal frame 10. Each notch 242 is defined by an inverted U-shaped surface 243. It is noted that the conductive material layer 22 is further attached to the inverted U-shaped surfaces 243 of the looped surrounding wall 24 of the cover body 20 such that the conductive material layer 22 is further in electrical contact with the protrusions 113 of the metal frame 10. In addition, the top wall 23 of the cover body 21 has a uniform thickness ranged from 0.13 mm to 0.15 mm, a horizontal first wall portion 231, a horizontal second wall portion 232, and an inclined third wall portion 233 having an upper end connected to one end of the first wall portion 231, and a lower end connected to one end of the second wall portion 232 such that a distance (h1) between a top surface of the first wall portion 231 and the circuit board 100 is larger than a distance (h2) between a top surface of the second wall portion 232 and the circuit board 100, and is not greater than 1.8 mm, wherein the second wall portion 232 is formed with a plurality of positioning holes 234 that are spaced apart from each other and that engage fittingly and respectively the positioning pins 122 of the partition wall 12 of the metal frame 10. Each positioning hole 234 is defined by an annular inner surface 235. It is noted that the conductive material layer 22 is further attached to the annular inner surfaces 235 of the top wall 23 of the cover body 21 such that the conductive material layer 22 is further in electrical contact with the positioning pins 122 of the partition wall 12 of the metal frame 10.

As shown in FIG. 5, a conductive glue 30 is attached between a top end 111 of the looped surrounding wall 11 of the metal frame 10 and the conductive material layer 24 of the cover 20, while a conductive glue 30' is attached to the conductive material layer 22 of the positioning pins 122, and covers a corresponding one of the positioning holes 234 in the second wall portion 232 of the top wall 23 of the cover body 20.

Figure 6:
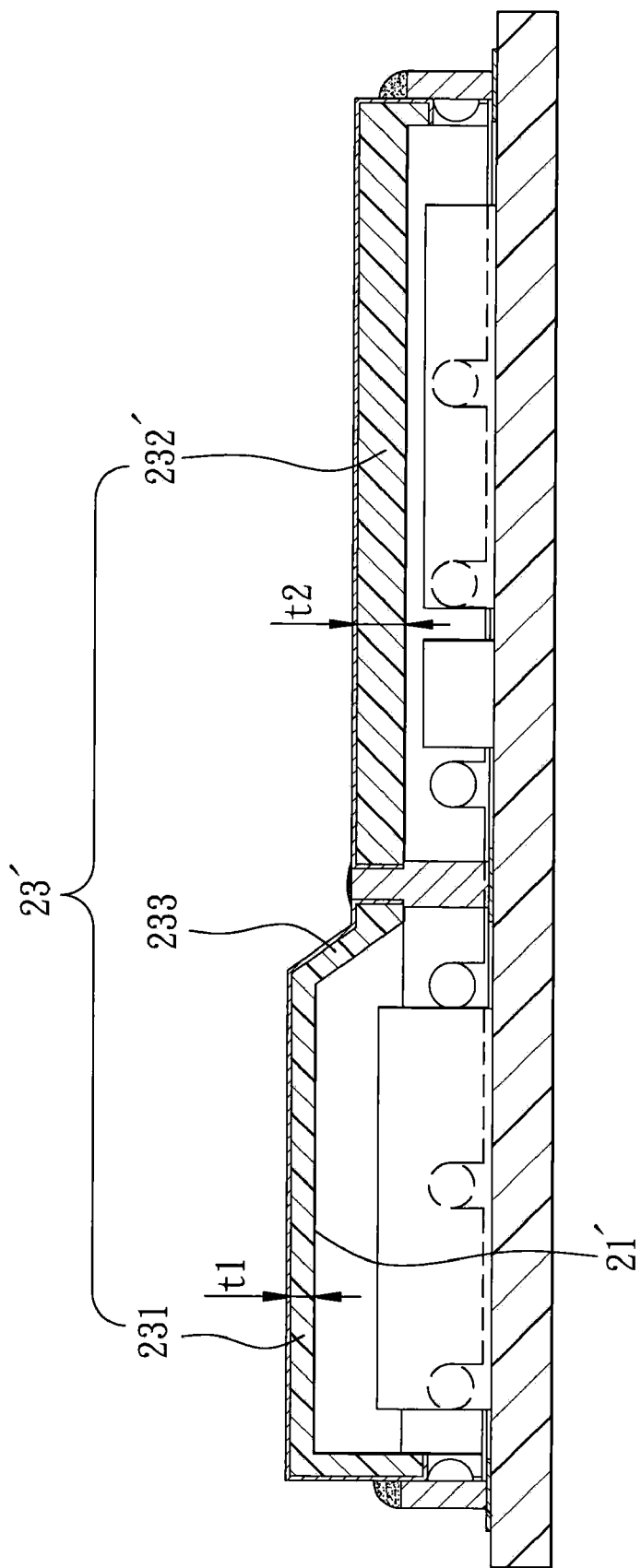
FIG. 6 is a schematic sectional view showing an electronic device employing the second preferred embodiment of an electromagnetic shielding device according to the present invention.

FIG. 6 illustrates the second preferred embodiment of an electromagnetic shielding device according to this invention, which is a modification of the first preferred embodiment. In this embodiment, since the cover body 21' is formed by injection molding, the top wall 23' of the cover body 21' is formed so that the first and third wall portions 231, 233 have a thickness (t1) less than a thickness (t2) of the second wall portion 232'.

In sum, due to the presence of the conductive material layer 22, the conductive glues 30, 30', the electromagnetic shielding device of the present invention can achieve an effective electromagnetic shielding effect. Furthermore, since the cover body 21, 21' is dielectric, the top wall 23, 23' of the cover body 21, 21' can be designed to be very close to the electronic component units 110, 120 or even contact the same without occurrence of short circuit, thereby facilitating miniaturization of the electronic device. On the other hand, since the cover body 21, 21' is formed by injection molding, the cover body 21, 21' can be easily fabricated to have desired height and thickness as required for the electronic device.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. An electromagnetic shielding device adapted to be disposed on a circuit board, comprising:
a metal frame adapted to be mounted on the circuit board and including a looped surrounding wall configured with an inner space, and a partition wall unit connected to said looped surrounding wall for dividing said inner space into at least first and second space portions; and
a cover mounted fittingly into said inner space in said metal frame, said cover including a dielectric cover body having an outer surface, and a conductive material layer attached to said outer surface of said dielectric cover body, said dielectric cover body having a top wall, and a looped surrounding wall extending downwardly from a periphery of said top wall and disposed in proximity to said looped surrounding wall of said metal frame such that the conductive material layer is in electrical contact with said looped surrounding wall of said metal frame, said cover cooperating with said metal frame so as to define at least first and second cavities corresponding respectively to said first and second space portions of said inner space in said metal frame, said first and second cavities having different depths;
wherein said partition wall unit of said metal frame includes a partition wall;
wherein said partition wall of said metal frame has a top end formed integrally with a plurality of positioning pins that are spaced apart from each other; and
wherein said top wall of said dielectric cover body of said cover is formed with a plurality of positioning holes that are spaced apart from each other and that engage fittingly and respectively said positioning pins of said partition wall of said metal frame.

2. The electromagnetic shielding device as claimed in claim 1, wherein:
said looped surrounding wall of said metal frame has a looped inner surface formed integrally with a plurality of protrusions that are spaced apart from each other; and
said looped surrounding wall of said dielectric cover body of said cover has a bottom end formed with a plurality of notches that are spaced apart from each other and that engage respectively said protrusions.

3. The electromagnetic shielding device as claimed in claim 1, further comprising a conductive glue attached between a top end of said looped surrounding wall of said metal frame and said conductive material layer of said cover.

4. The electromagnetic shielding device as claimed in claim 1, wherein each of said positioning holes is defined by an annular inner surface, said conductive material layer being further attached to said annular inner surfaces of said top wall of said dielectric cover body such that said conductive material layer is further in electrical contact with said positioning pins of said partition wall of said metal frame.

5. The electromagnetic shielding device as claimed in claim 1, wherein said top wall of said dielectric cover body of said cover has a horizontal first wall portion, a horizontal second wall portion, and an inclined third wall portion having an upper end connected to one end of said first wall portion, and a lower end connected to one end of said second wall portion, the depth of said first cavity being greater than that of said second cavity, said second wall portion being formed with said positioning holes.

6. The electromagnetic shielding device as claimed in claim 1, wherein said top wall of said dielectric cover body has a uniform thickness, the depth of said first cavity being greater than that of said second cavity.

7. The electromagnetic shielding device as claimed in claim 1, wherein said top wall of said dielectric cover body has a top surface, a distance between said top surface of said top wall of said dielectric cover body and the circuit board being not greater than 1.8 mm.

8. The electromagnetic shielding device as claimed in claim 1, wherein said conductive material layer is made of metallic paint.

9. The electromagnetic shielding device as claimed in claim 2, wherein each of said notches is defined by an inverted U-shaped surface, said conductive material layer being further attached to said inverted U-shaped surfaces of said looped surrounding wall of said dielectric cover body such that said conductive material layer is further in electrical contact with said protrusions of said looped surrounding wall of said metal frame.

10. The electromagnetic shielding device as claimed in claim 4, further comprising a conductive glue attached to said conductive material layer of said cover, disposed on a top end of each of said positioning pins, and covering a corresponding one of said positioning holes in said top wall of said dielectric cover body.

11. The electromagnetic shielding device as claimed in claim 5, wherein said first wall portion of said top wall of said dielectric cover body has a thickness different from that of said second wall portion.

12. The electromagnetic shielding device as claimed in claim 6, wherein the thickness of said top wall of said dielectric cover body is ranged from 0.13 mm to 0.15 mm.

* * * * *